(12) United States Patent
Wuu et al.

(10) Patent No.: US 11,527,270 B2
(45) Date of Patent: Dec. 13, 2022

(54) HYBRID LIBRARY LATCH ARRAY

(71) Applicant: Advanced Micro Devices, Inc., Santa Clara, CA (US)

(72) Inventors: John J. Wuu, Ft. Collins, CO (US); Russell J. Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/359,253

(22) Filed: Jun. 25, 2021

(65) Prior Publication Data
US 2022/0366945 A1    Nov. 17, 2022

Related U.S. Application Data

(60) Provisional application No. 63/185,207, filed on May 6, 2021.

(51) Int. Cl.
| | | |
|---|---|---|
| *G11C 7/00* | (2006.01) | |
| *G11C 7/10* | (2006.01) | |
| *H03K 19/173* | (2006.01) | |
| *G11C 7/12* | (2006.01) | |

(52) U.S. Cl.
CPC ............ *G11C 7/106* (2013.01); *G11C 7/1069* (2013.01); *G11C 7/1087* (2013.01); *G11C 7/12* (2013.01); *H03K 19/1737* (2013.01)

(58) Field of Classification Search
CPC .................................................. H03K 19/1737
USPC ................................................... 365/189.02
See application file for complete search history.

(56) References Cited

U.S. PATENT DOCUMENTS

| | | | |
|---|---|---|---|
| 2009/0146689 A1* | 6/2009 | Chandler | ......... H03K 19/17732 |
| | | | 326/41 |
| 2010/0091585 A1* | 4/2010 | Wang | ..................... G11C 11/412 |
| | | | 365/189.011 |
| 2016/0217835 A1 | 7/2016 | Blott et al. | |
| 2018/0240520 A1 | 8/2018 | Best | |
| 2020/0388329 A1* | 12/2020 | Choserot | .................. G11C 8/10 |
| 2021/0124701 A1 | 4/2021 | Lee et al. | |

FOREIGN PATENT DOCUMENTS

| | | |
|---|---|---|
| KR | 10-2013-0033230 A | 4/2013 |
| KR | 10-2016-0042083 A | 4/2016 |

OTHER PUBLICATIONS

International Search Report and Written Opinion dated Aug. 12, 2022, in Application No. PCT/US2022/027791, 11 pages.

* cited by examiner

*Primary Examiner* — Hoai V Ho
(74) *Attorney, Agent, or Firm* — Zagorin Cave LLP

(57) ABSTRACT

A static random access memory (SRAM) includes fast SRAM bit cells and fast multiplexer circuits that are formed in a first row of fast cells in a hybrid standard cell architecture. Slow SRAM bit cells and slow multiplexer circuits are formed in a second row of slow cells. The slow multiplexer circuits provide a column output for the fast SRAM bit cells and the fast multiplexer circuits provide a column output for the slow SRAM bit cells. Thus, one SRAM column has fast bit cells and slow multiplexer stages while the adjacent SRAM column has slow bit cells and fast multiplexer stages to thereby provide an improved performance balance when reading the SRAM.

20 Claims, 12 Drawing Sheets

| DUM | PFB2 | PWD | PPG | PFB0 | PFB1 | PINV | DUM | PRP1 | PRP0 |
|---|---|---|---|---|---|---|---|---|---|
| PKSTK | VDD | WD | D | PKSTK | VDD | D_X | VDD | | RD |
| NKSTK | VSS | WD | D | NKSTK | VSS | D_X | VSS | | RD |
| DUM | NFB2 | NWD | NPG | NFB0 | NFB1 | NINV | DUM | NRP1 | NRP0 |

FIG. 7

| PWD | PPG | PFB0 | PFB1 | PINV | DUM | PRP1 | PRP0 |
|---|---|---|---|---|---|---|---|
| VDD | WD | D | | VDD | D_X | VDD | | RD |
| VSS | WD | D | | VSS | D_X | VSS | | RD |
| NWD | NPG | NFB0 | NFB1 | NINV | DUM | NRP1 | NRP0 |

FIG. 10

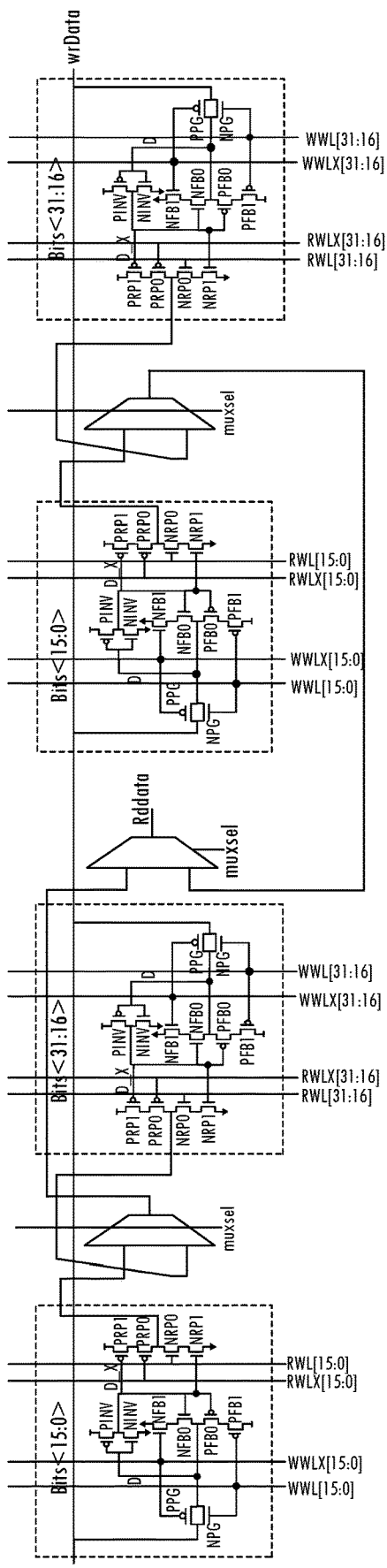
FIG. 11
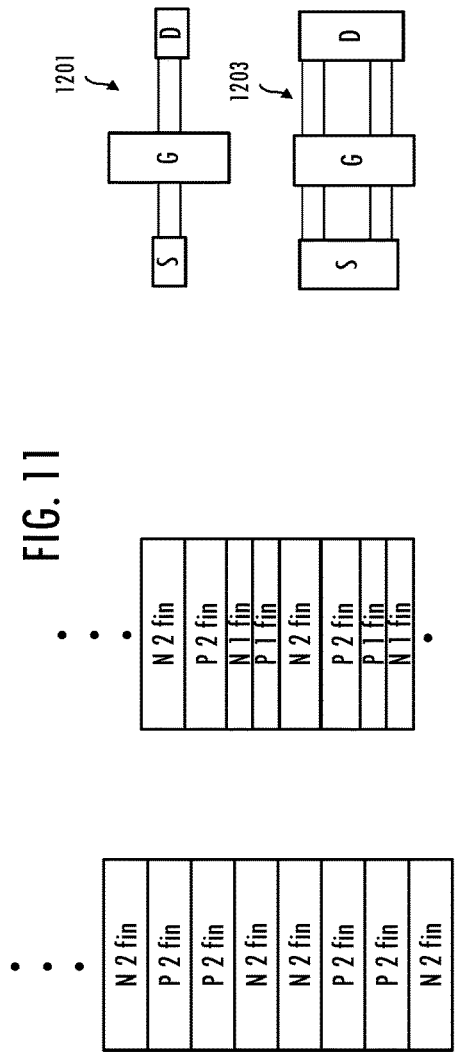
FIG. 12C
FIG. 12B
FIG. 12A

HYBRID LIBRARY LATCH ARRAY

CROSS-REFERENCE TO RELATED APPLICATION(S)

This application claims benefit of provisional application 63/185,207 filed May 6, 2021, entitled "Latch Bit Cell, Write Masked Latch Bit Cell, and Hybrid Library Latch Array", naming Russell J. Schreiber and John J. Wuu as inventors, which application is incorporated herein by reference.

BACKGROUND

Description of the Related Art

This application relates to SRAMs and SRAM bit cells. SRAMS traditionally use 6T or 8T bit cells. Because SRAMS typically include a large number of bit cells, ensuring efficiency in SRAM bit cell area utilization is important to reduce the cost of the SRAM in terms of silicon area utilized.

SUMMARY OF EMBODIMENTS OF THE INVENTION

Accordingly, in one embodiment a static random access memory (SRAM) includes a first plurality of bit cells and a first plurality of multiplexer circuits. The SRAM further includes a second plurality of bit cells and a second plurality of multiplexer circuits. The first plurality of bit cells are coupled to a first multiplexer circuit of the second plurality of multiplexer circuits and the second plurality of bit cells are coupled to a second multiplexer circuit of the first plurality of multiplexer circuits. The first plurality of bit cells and the first plurality of multiplexer circuits have a first performance level and the second plurality of bit cells and the second plurality of multiplexer circuits have a second performance level that is lower than the first performance level.

In another embodiment a method for operating a static random access memory (SRAM) includes supplying first bit cell outputs from a first plurality of bit cells to a first multiplexer, the first plurality of bit cells having a first performance level and the first multiplexer having a second performance level that is lower than the first performance level. The first multiplexer supplies one of the first bit cell outputs as a first multiplexer output signal from the first multiplexer. The method further includes supplying second bit cell outputs from a second plurality of bit cells having the second performance level to a second multiplexer having the first performance level. The second multiplexer supplies one of the second bit cell outputs as a second multiplexer output signal.

A static random access memory (SRAM) includes a first plurality of SRAM bit cells and a first multiplexer circuit formed of standard cells in a first row of cells having a first performance level. A second plurality of SRAM bit cells and a second multiplexer circuit are formed in a second row of second cells with a second performance level that is lower than the first performance level. The second multiplexer circuit receives respective first outputs of the first plurality of bit cells and selects one of the respective first outputs as a second multiplexer output signal. The first multiplexer circuit receives respective second outputs of the second plurality of SRAM bit cells and selects one of the respective second outputs as a first multiplexer output signal.

BRIEF DESCRIPTION OF THE DRAWINGS

The present invention may be better understood, and its numerous objects, features, and advantages made apparent to those skilled in the art by referencing the accompanying drawings.

FIG. 7 illustrates a layout of the write masked latch bit cell.

FIG. 10 illustrates a layout of the write masked latch bit cell of FIG. 8.

FIG. 11 illustrates an embodiment of a column formed by the latch bit cells of FIG. 1.

FIG. 12A illustrates a traditional standard cell architecture with two fins per transistor finger.

FIG. 12B illustrates a hybrid standard cell architecture with alternating cells of two fins per transistor finger and one fin per transistor finger.

FIG. 12C illustrates a high level block diagram of finfets with one fin per transistor finger and two fins per transistor finger.

The use of the same reference symbols in different drawings indicates similar or identical items.

DETAILED DESCRIPTION

Figures 1, 2:
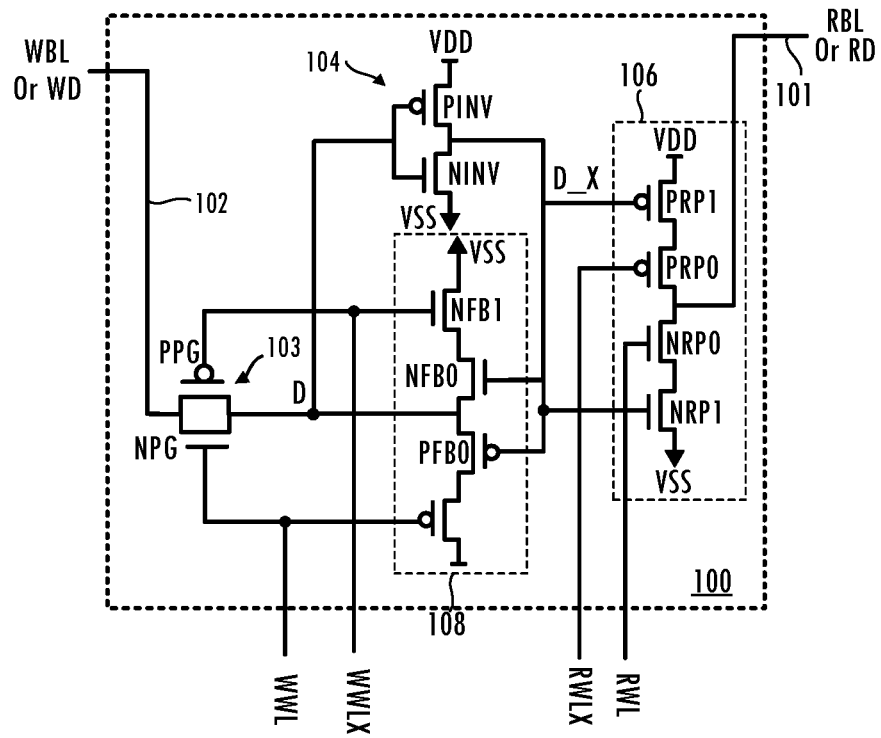
FIG. 1 illustrates an embodiment of a latch bit cell according to an embodiment.
FIG. 2 illustrates an example layout of the latch bit cell.

Eight transistor (8T) static random access memory (SRAM) arrays are not scaling well in terms of area in newer technology nodes. However, circuits built with standard cell design rules continue to scale relatively well in newer technology nodes. Building SRAM arrays with standard cell design rules allows a smaller area to be used even though there are more transistors. FIG. 1 illustrates an SRAM bit cell implemented as a latch bit cell 100 with separate read and write ports. Note that the latch bit cell 100 uses 12 transistors per bit as compared to the 8 transistors of an 8T SRAM bit cell but still uses less area in certain manufacturing technologies due to use of the standard cell design rules. A significant difference between a latch type bit cell and classic 6T/8T SRAM bit cells is the latch bit cell disables the feedback during writes. In contrast in 6T/8T bit cells, the pass gate has to fight the pullup to perform the write. The latch bit cell does not have such contention during writes.

The approach of FIG. 1 implemented using standard cell design rules means the overhead required for the use of custom SRAM macros disappears thereby reducing area. For example, the use of standard cell layout rules allows 0 connected poly pitch (CPP) (distance in horizontal direction between transistors) abutment into standard cell logic. More traditional approaches to SRAMs have boundary cells and edge cells needed for lithographic purposes. Since standard cell design rules scale well, implementing SRAM cells based on the latch bit cell 100 and standard cell design rules allows SRAM designs to scale in area similarly to standard architectures in the future.

The latch bit cell illustrated in FIG. 1 amortizes local inverters usually present in latches across many more cells. The latch bit cell illustrated in FIG. 1 removes local inverters that would traditionally be used on inputs into the latch including the write bit line (WBL), write word line (WWL), the active low write word line (WWLX), read word line (RWL), and the active low read word line (RWLX). In more traditional arrays of latches, CMOS combining stages are used between latches. The latch bit cell 100 uses a tristate output for RBL 101. The use of a tristate driver by the latch bit cell allows the output (read bit lines) of several cells, e.g., 16, to be combined together using tristate output drivers to avoid any additional combining stages (such as NOR/NANDing) of the output data.

FIG. 2 illustrates a stick layout of the latch bit cell 100 showing 7 transistors in a horizontal direction. The boxes show the source/drain connections for the transistors. The gate regions of the transistors are shown as vertical lines with the same label as the transistors in FIG. 1. The long vertical lines 201 indicate a shared gate connection, e.g., by transistors PFBO and NFBO and transistors PINV and NINV. Where there is a blank in the box, there is a node that is not named in FIG. 1 but any unidentified source/drain connections as well as gate connections can be readily seen in FIG. 1. The layout includes a dummy cell (DUM) transistor. A dummy is a transistor that is formed but not connected. The use of the dummy transistor provides an efficient way to provide isolation between other transistors. The use of the dummy transistor also provides an advantage in the ability to change the type of transistors used in terms of threshold voltage (Vt). In embodiments, the write portion of the latch (transistors PPG, NPG, PINV, NINV, NFB1, NFB0, PFB0 and PFB1) does not need high performance but the read portion of the latch (transistors PRP1, PRP0, NRP0, and NRP1) does need high performance. Note that the first letter of the transistor name refers to the type of transistor (N or P) and the remaining letters refer to its function (PG—pass gate, INV— inverter, FB— feedback, RP-read port)

Figure 3:
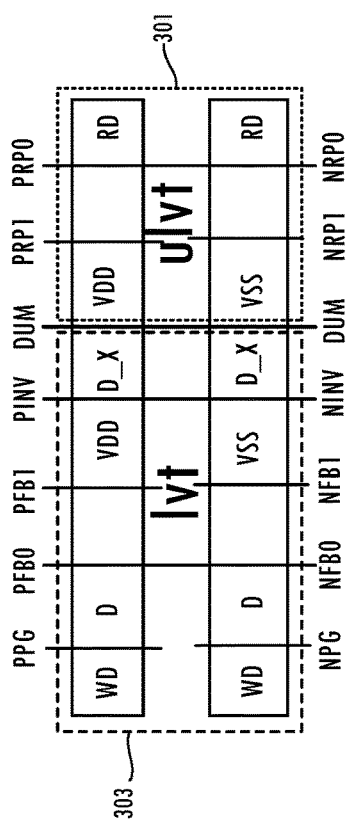
FIG. 3 illustrates how different threshold voltages may be used in read and write portions of the latch bit cell.

With reference to FIG. 3, that allows the read portion 301 of the latch bit cell 100 including transistors PRP0, PRP1, NRP0, and NRP1 to be implemented using lower Vt (such as ultra low Vt (ulvt)) transistors thereby providing the required high performance, while the write portion 303 of the latch bit cell 100 on the left side of the dummy transistor in FIG. 3 are implemented with higher threshold voltage transistors (such as low Vt (lvt)) transistors). The higher Vt transistors provide lower performance but also less leakage and the lower Vt transistors are utilized only where needed for performance. Thus, the layout options allow different threshold voltages to be utilized on the read port and the write port, which have different performance requirements, thereby allowing leakage current to be reduced as compared to having to use lower Vt devices for all devices to meet performance requirements for only a portion of the bit cell. Transistors in the read port and write port share diffusion between neighboring cells where possible cutting in half the xtor (transistor) load over an unoptimized design.

Referring back to FIG. 1, the operation of the latch bit cell 100 will now be described. The data to be written to the cell on the write bit line WBL 102 (also referred to herein as write data (WD) is supplied to the pass gate 103 formed of transistors NPG and PPG. The gates or those transistors are coupled respectively to write word line (WWL) and write word line X (WWLX), where "X" represents the signal is active low. When WWL and WWLX are asserted, the data on WBL is passed as data "D" into the inverter 104 formed by the transistors PINV and NINV. The transistors NFB1 and PFB1 are turned off when WWL and WWLX are asserted. The gates of NFB0 and PFB0 in the feedback portion of the bit latch cell 100 receive the output D_X (the inverted value of "D") from the inverter. The gates of PRP1 and NRP1 in the read portion 106 of the latch also receive D_X. When WWL and WWLX deassert, the pass gate 103 shuts off and the transistors NFB1 and PFB1 turn on allowing D_X to turn on one of the transistors NFB0 or PFB0 to supply "D" as a feedback signal. The transistors NFB1, NFB0, PFB0, and PFB1 function as a keeper circuit 108, and along with the inverter formed by transistors PINV and NINV, ensure that the data on node D is maintained when WWL and WWLX are deasserted. In that way, the value of D is maintained in the write portion of the latch bit cell 100 and available when the latch is read. In the latch bit cell 100, the PMOS transistors PINV, PFB1, and PRP1 are coupled to a supply voltage (VDD) at their sources. The NMOS transistors NINV, NFB1, and NRP1 are coupled to a second supply voltage (ground) at their sources.

In order to read the latch bit cell, the read word line (RWL) and RWLX assert turning on NRP0 and PRP0 respectively. Remember that the "X" indicates an active low signal. The assertion of RWL and RWLX allows the value of D_X to determine the value of the output signal read bit line (RBL) 101, which is also referred to herein as read data (RD). When RWL and RWLX deassert, RBL is set to high impedance to allow other SRAM cells to drive RBL when the other SRAM cells are selected to be read.

Figure 4:
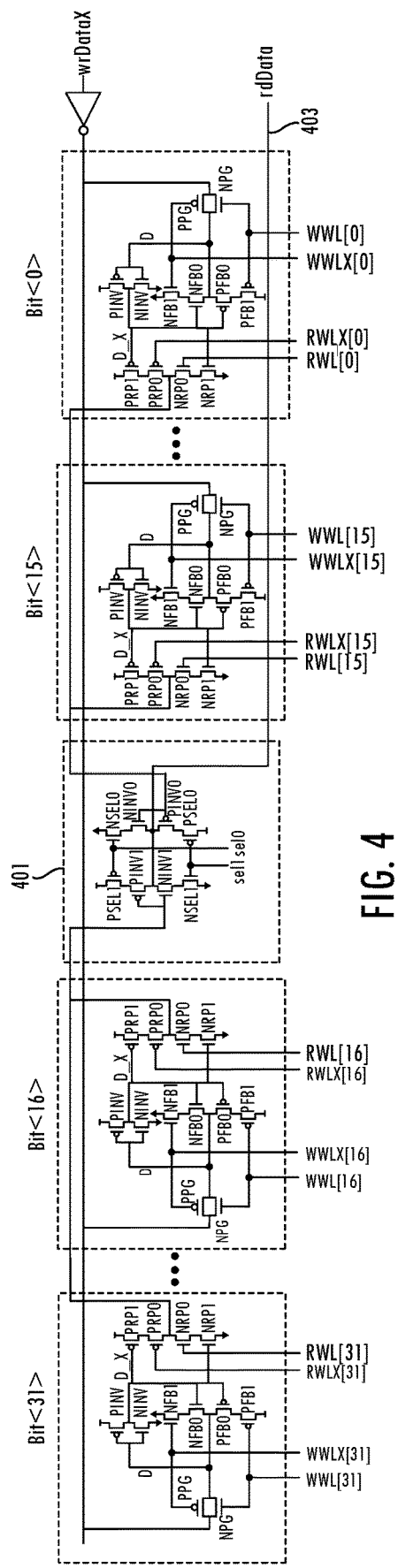
FIG. 4 illustrates a column of 32 latch bit cells.
Figure 5:
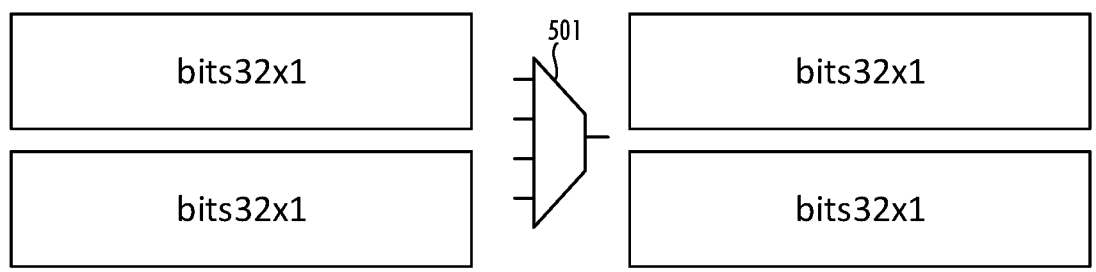
FIG. 5 illustrates a high level block diagram of two columns each with 64 rows of latch bit cells.

FIG. 4 illustrates an embodiment in which a group of 32 latch bit cells are formed in two groups of latch bit cells (bits <31:16> and bits <15:0>). Each group of latch bit cells supplies a bit to multiplexer 401, which selects a bit from either bits <31:16> or a bit from bits <15:0> and supplies the selected bit on rdData 403. In the embodiment of FIG. 4, the three state driver on the read side of the latch bit cells allows 16 bits (only one active at a time) to drive the same RBL supplied to multiplexer 401. Thus, only one RWL/RWLX is turned on at a time in each grouping [31:16] and [15:0] to ensure multiple latch bit cells not drive the RBL at the same time, which would cause a high current situation. It is also important to ensure that one of the RWL/RWLX signals is active causing one of the bit cells to drive a high or low logic level onto the RBL. All the RWL/RWLX pairs being deasserted would result in a floating node on RBL, which can cause high current draw in downstream CMOS gates receiving a signal mid-way between VDD and VSS FIG. 5 illustrates a block diagram of an embodiment having 64 rows of bit cells and two columns and a multiplexer 501 selects one bit from the 64 rows and two columns. While not shown in FIG. 5 for ease of illustration, the embodiment of shown in FIG. 5 requires a write column multiplexer function as well. One way to accomplish that is to supply a WWL/WWLX pair to even physical columns and another WWL/WWLX pair to odd physical columns. In that way every other cell can be written. Another way to accomplish the write multiplexer function is to use write masks as described further herein.

During write operations when the word line(s) for a particular word line are asserted, all the bits in the word line can change state. Rather than changing state of all the bits in the word line, it can be advantageous to only write selected cells of the word line, which helps make write operations more efficient. Accordingly, in another embodiment illustrated in FIG. 6, the latch bit cell 600 includes a write mask. The write mask utilizes the signals write one X (WRONEX), where "X" represents the signal is active low, and write zero (WRZERO). The write mask circuit is formed by transistors PWD 601 and NWD 603, where WD stands for write data. When WRONEX is asserted (active low), the write data (WD) node is pulled high through transistor PWD and when WRZERO is asserted, and the WD node is pulled low through transistor NWD. The write mask allows a write word line for a row of cells to be asserted without changing state in all of cells. For example, only a byte or a few bits on a word line can be changed by asserting the word line and using write masks to ensure only those cells of interest are written. In addition to the transistors PWD and NWD used to determine the value of WD, the write masked latch bit cell 600 includes transistors NFB2 and PFB2 used in the keeper circuit 605. Those transistors are used to make sure the feedback function of the keeper circuit continues to work so the latch bit cell maintains state even when WWL and WWLX are asserted. If WWLX is asserted, NFB1 turns off and if WWL is asserted PFB1 turns off. The transistors NFB2 and PFB2 ensure that if the bit has a write mask in effect blocking writing of the latch bit cell, the keeper circuit keeps driving "D" with the correct value from the node between NFB0 and PFB0 when WWL and WWLX are asserted. Note that WD will float when WRONEX and WRZERO are deasserted. By incorporating the PWD and NWD transistors into the bit cell itself, the capacitance on the intermediate node WD is kept low enough to avoid cell stability issues when WWL/WWLX are asserted. The keeper stack (KSTK) nodes PKSTK 602 and NKSTK 604 are labeled in FIG. 6.

Figure 6:
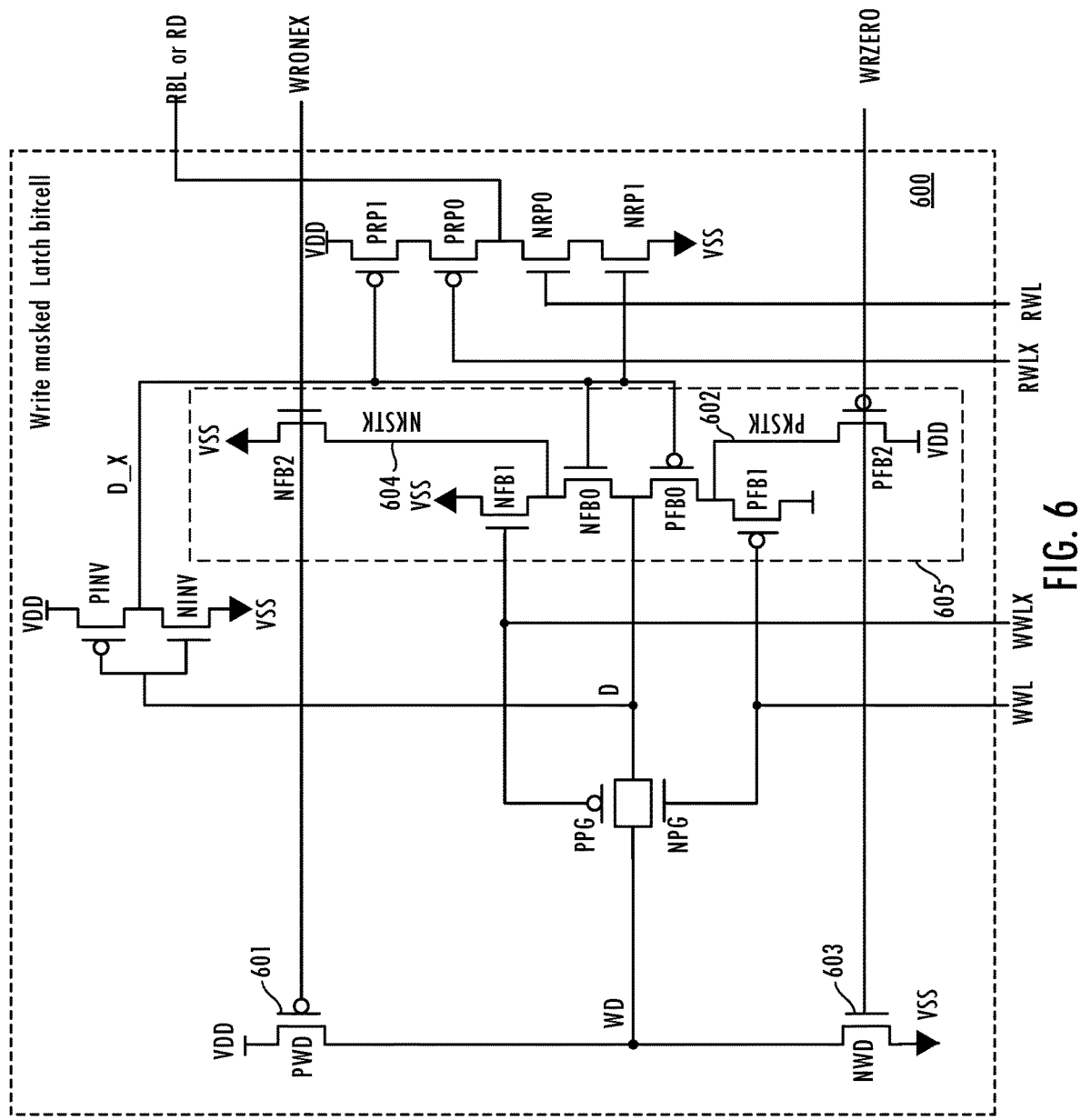
FIG. 6 illustrates an embodiment of a write masked latch bit cell.

FIG. 7 illustrates a stick figure of the layout of the write masked latch bit cell 600 shown in FIG. 6. Note that the solution of FIG. 6 increases the size of the cell by four transistors and includes an extra dummy cell as compared to the layout shown in FIG. 2. Thus, the write masked latch bit cell 600 (FIG. 6) shows an increase of 3 CPP to 10 CPP as compared to the layout of FIG. 2 (7 CPP) for latch bit cell 100 shown in FIG. 1.

Figure 8:
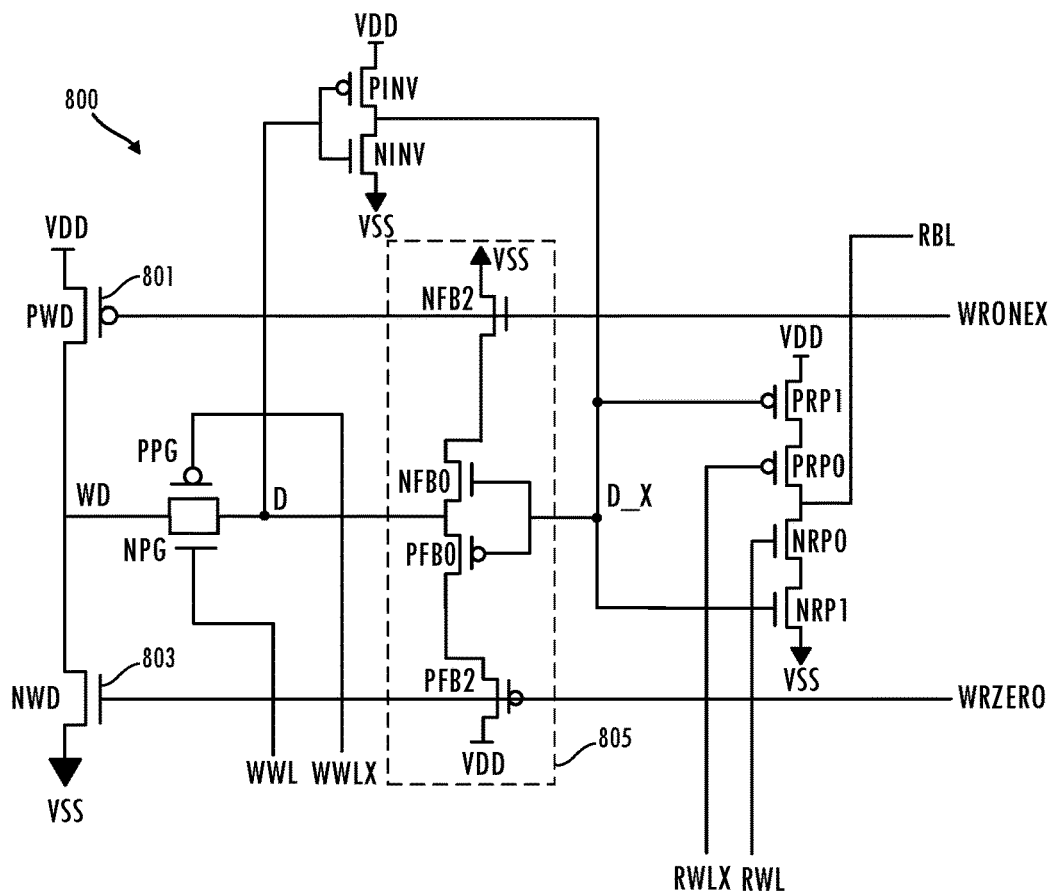
FIG. 8 illustrates another embodiment of a write masked latch bit cell.

FIG. 8 shows a more efficient embodiment of a write masked latch bit cell 800 as compared to the write masked latch bit cell 600 FIG. 6. Note that the extra transistors NFB2 and PFB2 coupled to keeper stack nodes in write masked latch bit cell 600 replace NFB1 and PFB1 in the write masked latch bit cell 800. The write masked latch bit cell 800 does not disable the keeper circuit 805 by turning off NFB1 and PFB1 when WWL and WWLX are asserted (see FIGS. 1 and 6) and instead, the write masked latch bit cell 800 only disables the keeper in response to WRONEX or WRZERO being asserted. That ensures the latch bit cell 800 holds state if the latch bit cell 800 is masked. Note that WWL and WWLX are coupled only to the pass gate transistors PPG and NPG in the write masked latch bit cell 800. When WRONEX is asserted (active low) transistor NFB2 turns off and when WRZERO is asserted transistor PFB2 turns off. Assuming WWLX and WWL are asserted, when WRONEX is asserted node WD goes high and node D goes high and when WRZERO is asserted (active low) node WD goes low and node D goes low. When the respective mask lines (WRONEX and WRZERO) are deasserted, both NFB2 and PFB2 are on and the keeper circuit maintains the value of node D according to the value of D_X provided by the inverter formed by transistors PINV and NINV. D_X turns on either transistor NFB0 to maintain a low value for node D or PFB0 to maintain a high value for node D. The write mask circuit is formed by transistors PWD 801 and NWD 803 and is similar to the embodiment illustrated in FIG. 6. The read side of the write masked latch bit cell 800 formed by transistors PRP1, PRP0, NRP0, and NRP1 is the same as in previous latch bit cell embodiments 100 and 600 shown in FIGS. 1 and 6, respectively.

Figure 9:
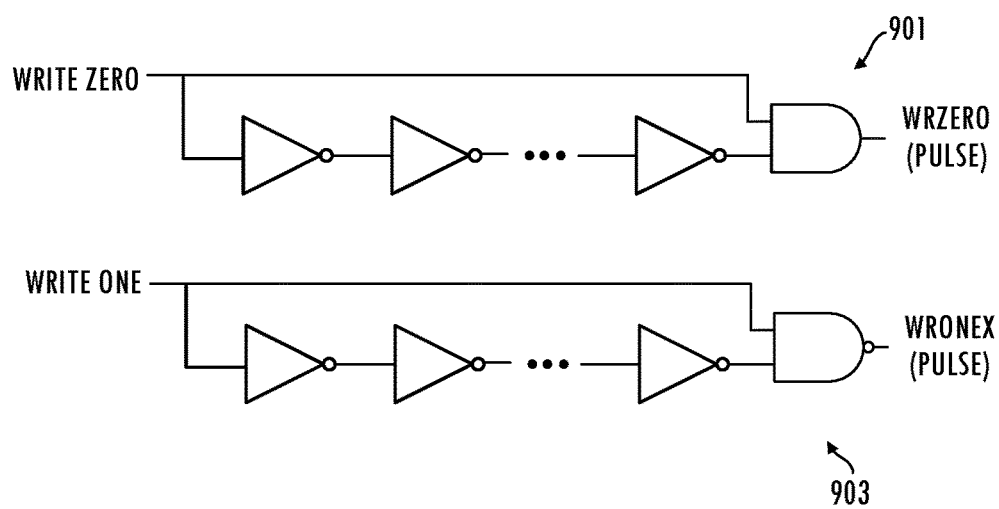
FIG. 9 illustrates an embodiment of a pulse generator to generate a WRZERO or a WRONEX pulse.

Whenever either WRONEX or WRZERO is asserted every bit cell in the column coupled to WRONEX and WRZERO will have their keeper circuit disabled since asserting WRONEX turns off NFB2 preventing D_X from being pulled to VSS through NFB0 and NFB2 and asserting WRZERO turns off PFB2 preventing D_X from being pulled to BDD through PFB0 and PBF2. Thus, node D will float responsive to the assertion of WRONEX or WRZERO. If the assertion of WRONEX or WRZERO is long enough, the cells along the column can change state since at least a portion of the keeper circuit is off due to NFB1 or PFB1 being disabled by the assertion of WRONEX or WRZERO. Therefore, WRONEX and WRZERO should be asserted as a pulsed write. Thus, those signals should be asserted as a self-timed pulse several inverter delays long, e.g., 50 ps. The pulse can be generated using, e.g., 9 inverters. The number of inverters depends on the technology being used. FIG. 9 shows an embodiment of pulse circuit 901 for WRZERO and pulse circuit 903 for WRONEX. Note that an odd number of inverters are used in each of the pulse circuits shown in FIG. 9. In FIG. 9, the inputs (WRITE ZERO and WRITE ONE) to the logic gates are assumed to be active high. Many other pulse generator circuits are known to those of skill in the art to provide a suitable pulse width for WRONEX and WRZERO. The pulse should be long enough to write the one cell but short enough that other cells along the column do not lose state due to node D floating during the pulse and thus there is a relatively small area penalty for the additional write mask capability as compared to the write masked latch bit cell shown in FIG. 6.

FIG. 10 shows an example layout for the circuit of FIG. 8. Note that only one dummy transistor is needed for the latch bit cell 800. The layout for latch bit cell 800 shown in FIG. 10 has only one extra CPP over the baseline latch bit cell 100 shown in FIG. 2.

FIG. 11 illustrates a latch array column of the latch shown in FIG. 1 formed in a single standard cell row. Note that the term "single standard cell row" refers to a physical row of an integrated circuit and not a logical row of the SRAM. In standard design with non-hybrid standard cell library rules all devices typically have the same number of fins. In traditional standard cell architecture all rows of devices have the same height. In the world of finfets, that generally means the same number of fins per finger as well. FIG. 12A illustrates a traditional standard cell architecture of PFETs and NFETs with 2 fins per finger. Each standard cell is uniform in the row and has a P and an N transistor.

Hybrid standard cell architectures utilize alternating rows of high performance and high density (but lower performance) standard cells. For example, in an embodiment that means two fins per transistor finger for the high performance cells and the lower performance cells have one fin per transistor finger. As shown in FIG. 12B, that results in alternating rows of taller and shorter cells and a shorter row. The advantage of hybrid standard cell architectures is smaller area and reduced power but the shorter cell height results in decreased performance compared to larger two fin cells. FIG. 12C illustrates an exemplary one fin per transistor finger device 1201 and a two fin per transistor finger device 1203.

Figure 13:
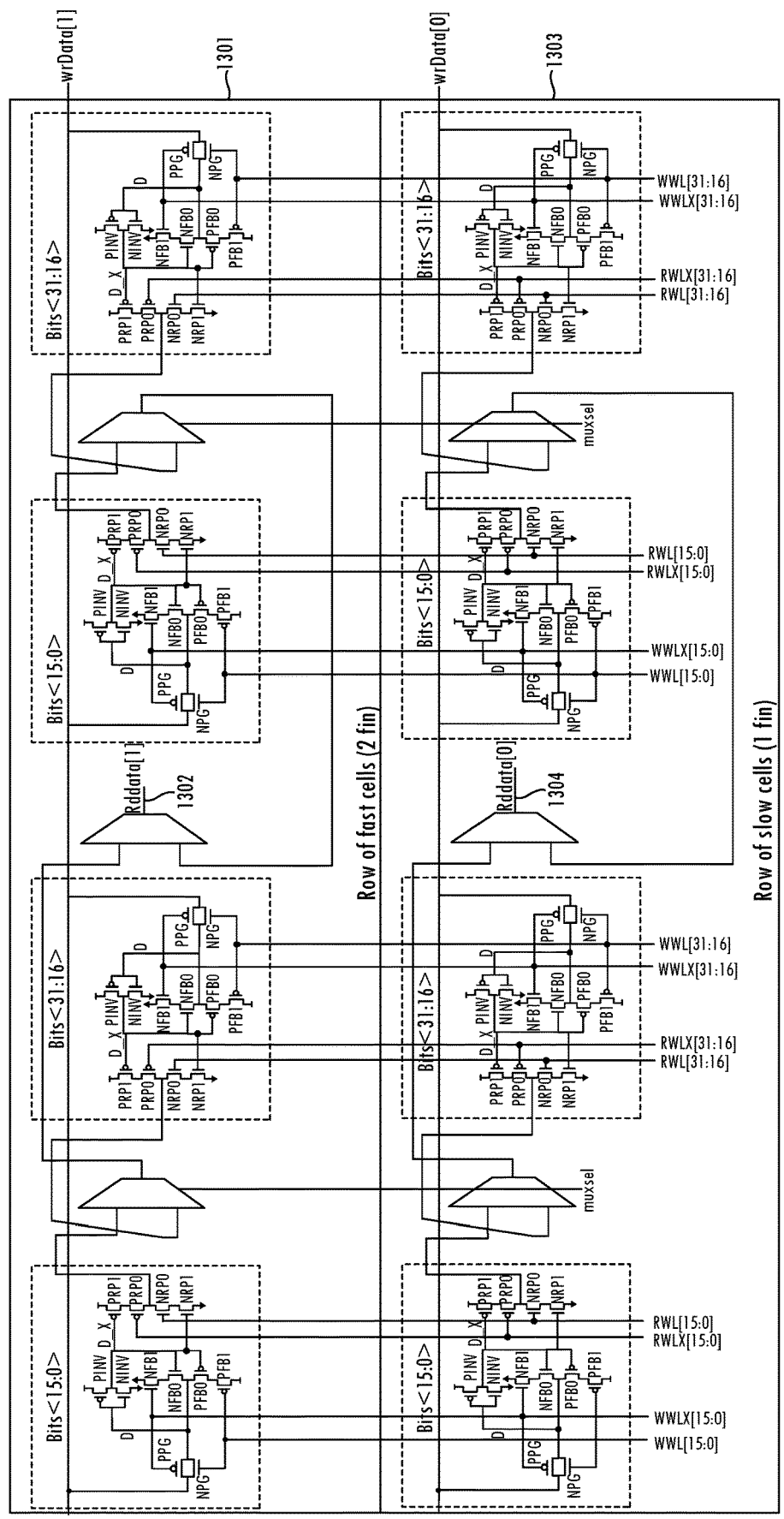
FIG. 13 illustrates an embodiment of a latch bit cell array utilizing a hybrid standard cell library.

FIG. 13 illustrates that moving from a traditional standard cell library to a hybrid standard cell library approach to building standard cell latch arrays can result in unbalanced performance between adjacent bits. For example, bit cells in column 1301 are formed of "fast" standard cells, e.g., with two fins per finger. The logical SRAM column 1301 is in a physical fast row of a hybrid row architecture in the illustrated embodiment. The bit cells in column 1303 are "slow" cells with, e.g., one fin per finger. Thus, reading Rddata[1] 1302 from one of the bit cells in column 1301 occurs faster than reading Rddata[0] 1304 from column 1302. Thus, adjacent bits are read with different timing (one fast and one slow), which is undesirable.

Figure 14:
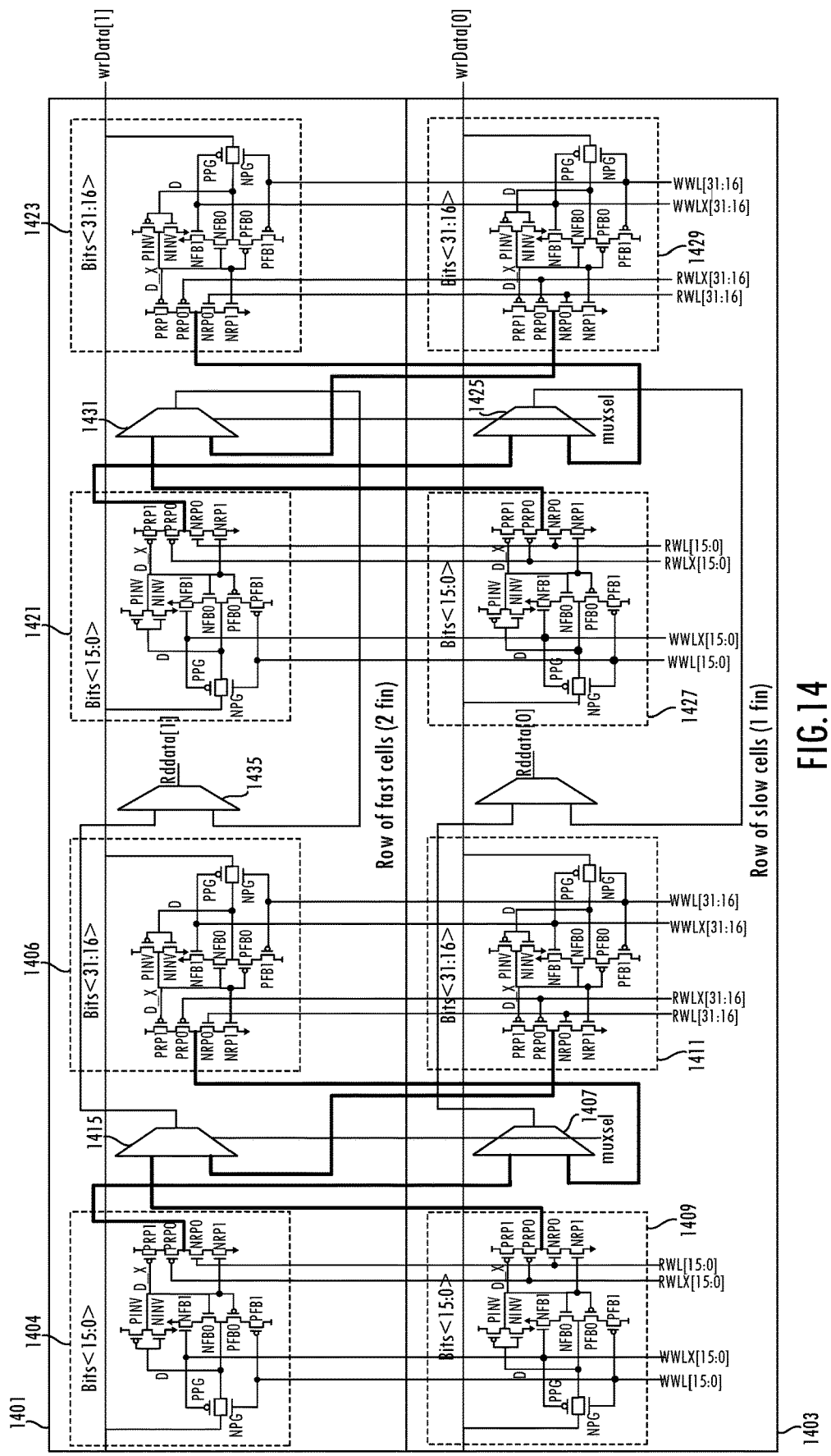
FIG. 14 illustrates an embodiment of a latch bit cell array utilizing a hybrid standard cell library that provides more balanced performance than the embodiment of FIG. 13.

In order to provide a more balanced performance between the fast and slow cells, the embodiment shown in FIG. 14 uses a group of the bit cells from one column, e.g., the bit cells in column 1401 (fast physical row) or 1403 (slow physical row), but uses the multiplexer circuits from the other row. For example, the slow multiplexer 1407 selects one bit from 32 fast bits cells. The 32 fast bit cells are fast bit cells 1404 (bits<15:0> only one of which is shown) and fast bits cells 1406 (bits<31:16> only one of which is shown. The fast multiplexer 1415 selects one bit from 32 slow bits cells. The 32 slow bit cells are slow bit cells 1409 (bits<15:0>) only one of which is shown) and slow bits cells 1411 (bits<31:16> only one of which is shown). Similarly fast bit cells 1421 and 1423 use slow multiplexer 1425 while slow bit cells 1427 and 1429 use fast multiplexer 1431. Read data (Rddata[1]) supplied by the fast multiplexer 1435 has fast multiplexers (2 fin) but slow bit cells (1 fin) and read data (Rddata[0]) has slow multiplexers (1 fin) but fast bit cells (2 fin). Thus, one logical SRAM column has fast bit cells and slow multiplexer stages while the adjacent SRAM logical column has slow bit cells and fast multiplexer stages. That provides an improved performance balance as compared to an array where every other bit has significantly different timing—fast and slow.

Figure 15:
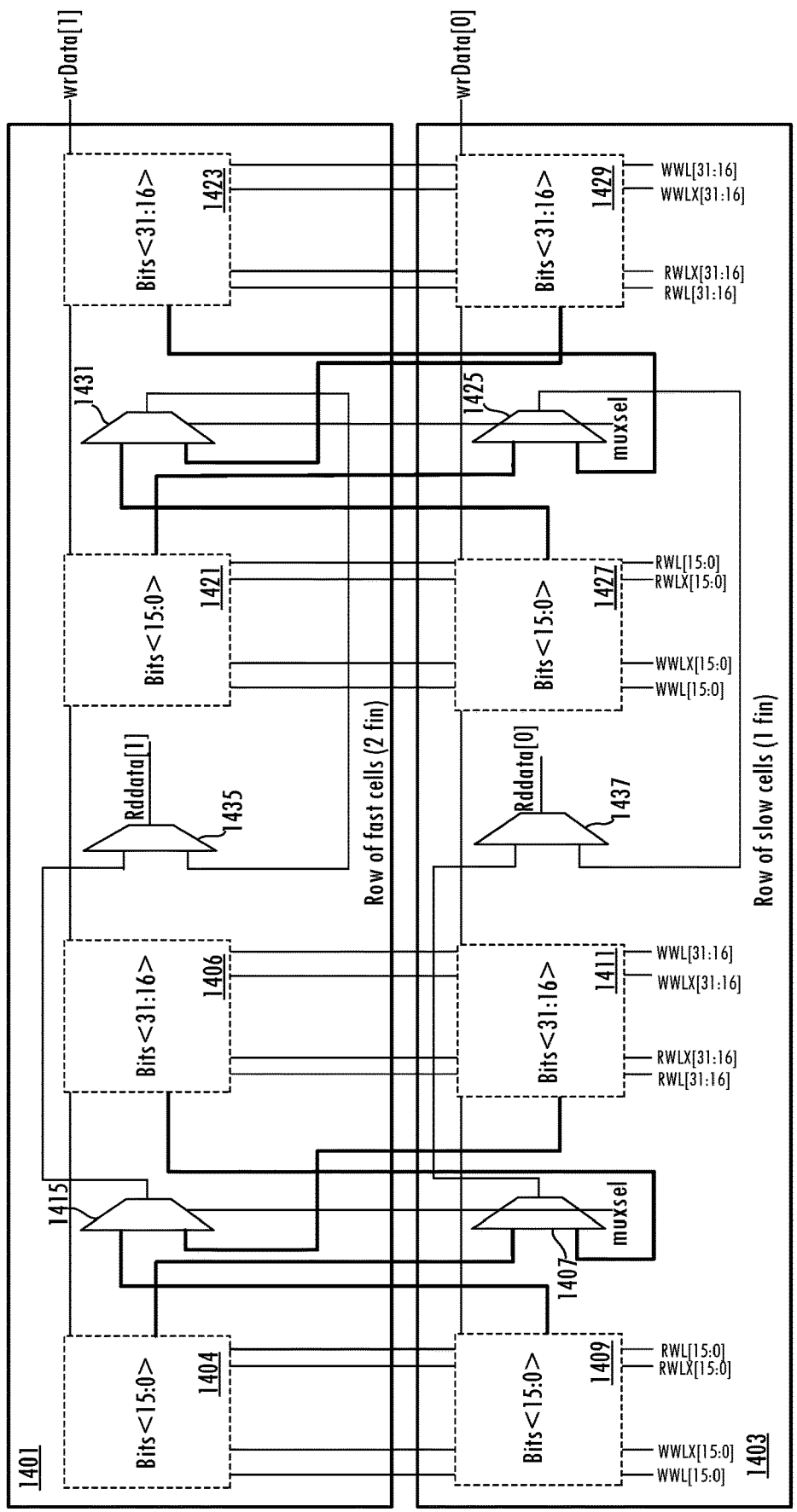
FIG. 15 illustrates a high level block diagram of an embodiment of a latch bit cell array.
Figure 16:
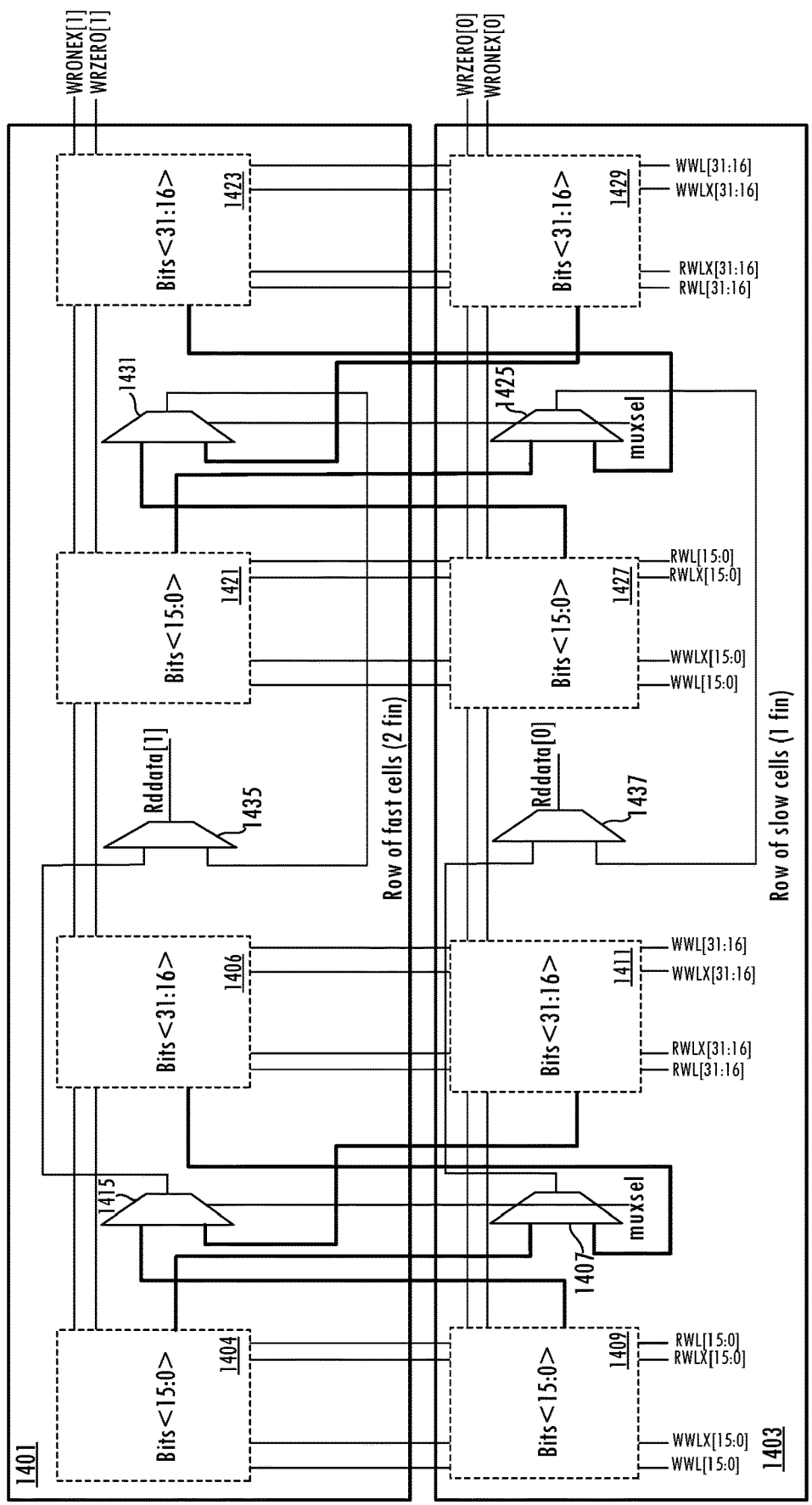
FIG. 16 illustrates a high level block diagram of an embodiment of a latch bit cell array using masked write bit cells.

FIG. 15 shows a higher level block diagram of an array of bit cells. While FIG. 14 shows the latch bit cell of FIG. 1 being utilized as the bit cells in the columns 1401 and 1403, in other embodiments other bit cells can be used. FIG. 16 illustrates an embodiment in which the masked write latch bit cell 600 of FIG. 6 or the masked write latch bit cell 800 of FIG. 8 is utilized. FIG. 16 shows the mask signals WRONEX and WRZERO signals being distributed to the bit cells.

Thus, a hybrid cell standard cell architectures has been described with alternating rows of high performance and high density standard cells in which bit cells and multiplexing stages are alternated to provide more balanced read timing. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A static random access memory (SRAM) comprising:
  a first plurality of bit cells and a first plurality of multiplexer circuits;
  a second plurality of bit cells and a second plurality of multiplexer circuits;
  wherein the first plurality of bit cells are coupled to a first multiplexer circuit of the second plurality of multiplexer circuits;
  wherein the second plurality of bit cells are coupled to a second multiplexer circuit of the first plurality of multiplexer circuits; and
  wherein the first plurality of bit cells and the first plurality of multiplexer circuits have a first performance level and the second plurality of bit cells and the second plurality of multiplexer circuits have a second performance level that is lower than the first performance level.

2. The SRAM as recited in claim 1 wherein the SRAM includes alternating rows of first cells with the first performance level and second cells with the second performance level.

3. The SRAM as recited in claim 1 further comprising:
  a third plurality of bit cells having the first performance level;
  a fourth plurality of bit cells having the second performance level;
  wherein the third plurality of bit cells are coupled to a third multiplexer circuit of the second plurality of multiplexer circuits; and
  wherein the fourth plurality of bit cells are coupled to a fourth multiplexer circuit of the first plurality of multiplexer circuits.

4. The SRAM as recited in claim 3,
  wherein the first multiplexer circuit and the third multiplexer circuit are coupled to a fifth multiplexer circuit of the second plurality of multiplexer circuits; and
  wherein the second multiplexer circuit and the fourth multiplexer circuit are coupled to a sixth multiplexer circuit of the first plurality of multiplexer circuits.

5. The SRAM as recited in claim 1 where the first performance level is determined, at least in part, according to a first number of fins per transistor finger and the second performance level is determined, at least in part, according to a second number of fins per transistor finger and the first number of fins is greater than the second number of fins.

6. The SRAM as recited in claim 5 wherein the first number of fins is two and the second number of fins is one.

7. The SRAM as recited in claim 1 wherein the first plurality of bit cells form at least a portion of a first column of the SRAM and the second plurality of bit cells form at least another portion of a second column of the SRAM.

8. The SRAM as recited in claim 7 wherein the first column and the second column are adjacent in the SRAM.

9. The SRAM as recited in claim 7 wherein each of the first plurality of bit cells and the second plurality of bit cells is a latch bit cell.

10. The SRAM as recited in claim 7 wherein each of the first plurality of bit cells and the second plurality of bit cells is a write masked bit cell.

11. A method for operating a static random access memory (SRAM) comprising:
  supplying first bit cell outputs from a first plurality of bit cells to a first multiplexer, the first plurality of bit cells having a first performance level and the first multiplexer having a second performance level that is lower than the first performance level;

supplying one of the first bit cell outputs as a first multiplexer output signal from the first multiplexer;

supplying second bit cell outputs from a second plurality of bit cells having the second performance level to a second multiplexer having the first performance level; and supplying one of the second bit cell outputs as second multiplexer output signal.

12. The method as recited in claim 11 further comprising:

supplying third bit cell outputs from a third plurality of bit cells with the first performance level to a third multiplexer having the second performance level and supplying a third multiplexer output signal; and supplying fourth bit cell outputs from a fourth plurality of bit cells having the second performance level to a fourth multiplexer having the first performance level and supplying a fourth multiplexer output signal.

13. The method as recited in claim 12, supplying the first multiplexer output signal and the third multiplexer output signal to a fifth multiplexer circuit having the second performance level and supplying a fifth multiplexer output signal; and supplying the second multiplexer output signal and the fourth multiplexer output signal to a sixth multiplexer circuit having the first performance level and supplying a sixth multiplexer output signal.

14. The method as recited in claim 13 further comprising:

supplying the fifth multiplexer output signal as a read data bit from a first SRAM column; and supplying the sixth multiplexer output signal as another read data bit from a second SRAM column that is adjacent to the first SRAM column.

15. The method as recited in claim 11 where the first performance level is determined, at least in part, according to a first number of fins per transistor finger and the second performance level is determined, at least in part, according to a second number of fins per transistor finger and the first number of fins is greater than the second number of fins.

16. The method as recited in claim 15 wherein the first number of fins is two and the second number of fins is one.

17. The method as recited in claim 11 further comprising supplying the first bit cell outputs from first write masked bit cells and the second bit cell outputs from second write masked bit cells.

18. A static random access memory (SRAM) comprising:

a first plurality of SRAM bit cells and a first multiplexer circuit formed in a first row of first cells with a first performance level;

a second plurality of SRAM bit cells and a second multiplexer circuit formed in a second row of second cells with a second performance level that is lower than the first performance level;

wherein the second multiplexer circuit is coupled to receive respective first outputs of the first plurality of SRAM bit cells and selects one of the respective first outputs as a second multiplexer output signal; and wherein the first multiplexer circuit is coupled to receive respective second outputs of the second plurality of SRAM bit cells and selects one of the respective second outputs as a first multiplexer output signal.

19. The static random access memory (SRAM) as recited in claim 18 wherein the first plurality of SRAM bit cells and the second plurality of SRAM bit cells are in adjacent SRAM columns.

20. The static random access memory (SRAM) as recited in claim 18 further comprising:

a third plurality of bit cells in the first row having the first performance level;

a fourth plurality of bit cells in the second row having the second performance level; and wherein the third plurality of bit cells are coupled to a third multiplexer circuit in the second row and the fourth plurality of bit cells are coupled to a fourth multiplexer circuit in the first row.

* * * * *